March 26, 1968 P. L. GARNER ETAL 3,375,143

METHOD OF MAKING TUNNEL DIODE

Filed Sept. 29, 1964

INVENTORS
PHILIP L. GARNER &
NICHOLAS FUSCHILLO
BY Hurvitz & Rose
ATTORNEYS

United States Patent Office 3,375,143

Patented Mar. 26, 1968

3,375,143

METHOD OF MAKING TUNNEL DIODE

Philip L. Garner, Palm Bay, Fla., and Nicholas Fuschillo, Falls Church, Va., assignors to Melpar, Inc., Falls Church, Va., a corporation of Delaware Filed Sept. 29, 1964, Ser. No. 399,989
5 Claims. (Cl. 148—1.5)

Figure 1:
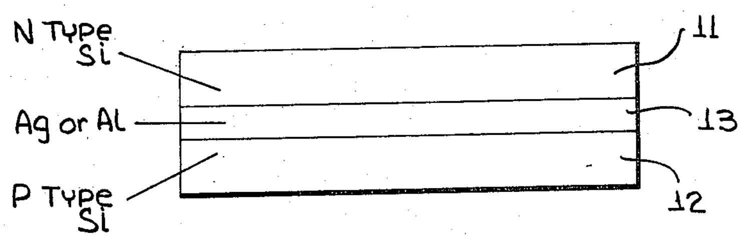

The present invention relates generally to methods for fabricating tunnel or Esaki diodes and more particularly to a method for forming tunnel diodes wherein a pair of opposite conductivity type, degenerate, monocrystalline semiconductor wafers are bonded together with a metal, and the junction is heated slightly above the eutectic temperature of the metal and wafers.

In the prior art, it has been customary when fabricating tunnel diodes to alloy a very small doped pellet into a wafer of degenerate monocrystalline semiconductor material having an opposite conductivity type of the pellet. When the alloying process is completed, a regrown region, having an area considerably smaller than the pellet, is formed on the wafer. The opposite conductivity wafer and regrown regions from a P-N space charge region or junction having the required characteristics for the quantam mechanic tunneling effect. Because of the extremely small area between the wafer and regrown region, the prior art devices have not generally been suited for power and current applications.

To obviate these low power restrictions, attempts have been made to form P-N junctions with the required characteristics for tunneling by fusing two opposite conductivity degenerate semiconductor wafers together. To bond the wafers together, it was necessary to raise the wafers to their melting points, for silicon 1420° C. Such temperatures are not feasible, however, because they cause the impurities in one wafer to diffuse into the other wafer, and vice versa, at a very rapid rate. Hence, the prime requirement for tunneling, a P-N junction having a space charge region with a steep space charge gradient between the opposite conductivity materials, is not satisfied with this prior art approach.

According to the present invention, a tunnel diode having a junction of large area is formed by bonding two degenerate, opposite conductivity type monocrystalline wafers together with the aid of a thin strip of metal sandwiched therebetween. The junction is heated slightly above the eutectic temperature of the semiconductor and the metal and is then quickly cooled. At the eutectic temperature, 370° C. for a gold strip and a silicon wafer, or slightly above, the metal strip becomes molten and 31% of the silicon in each wafer mixes with all of the molten metal. No diffusion occurs between the semiconductor and the metal strip; instead the process is somewhat similar to alloying.

Significant mixture of the opposite conductivity type carriers does not occur to cause deleterious effects on the tunneling characteristics of the junction because, at the eutectic temperature, the migration rates of the impurities through the wafers are considerably less than at the semiconductor melting point. Because the interface between the two opposite conductivity wafers may be quite large, the current and power handling capabilities of the device are extended considerably beyond existing state of the art junctions.

It is, accordingly, an object of the present invention to provide a new and improved tunnel diode, and method for manufacturing same.

Another object of the present invention is to provide a method for manufacturing tunnel diodes having large junction, hence considerable current and power handling capabilities.

An additional object of the present invention is to provide a new and improved semiconductor structure, and a method for fabricating the semiconductor.

Figure 2:
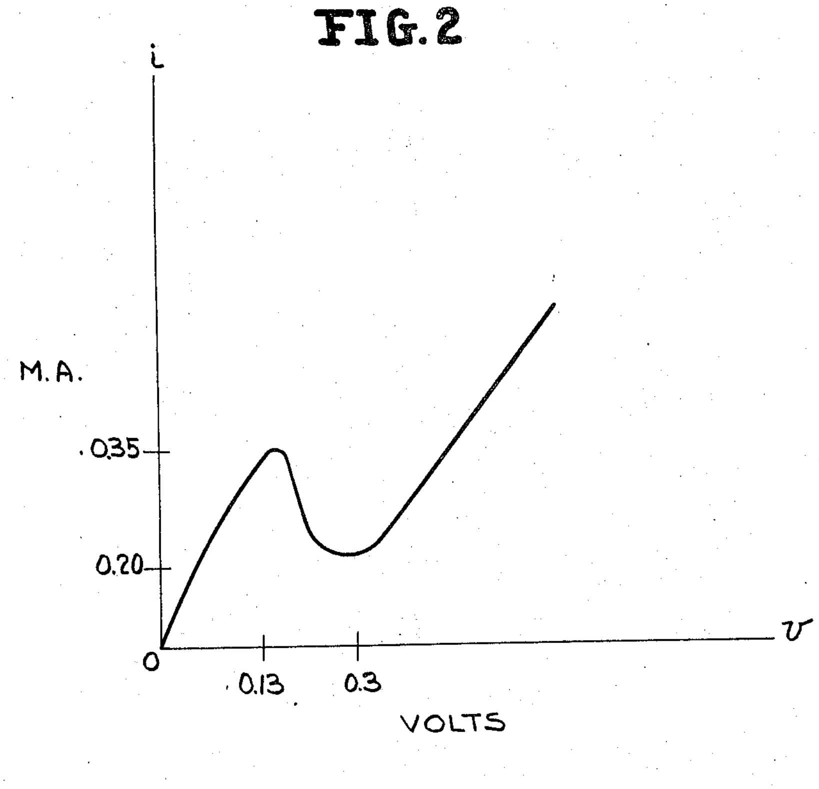

The above and still further objects, features and advantages of the present invention will become apparent upon consideration of the following detailed description of one specific embodiment thereof, especially when taken in conjunction with the accompanying drawings, wherein:

FIGURE 1 is a sectional schematic diagram of a preferred embodiment of the invention just prior to fusing of the two semiconductor wafers; and FIGURE 2 is a diagram of the characteristic response curve of a device formed in accordance with the present invention.

Referring now to FIGURE 1 of the drawings, there are illustrated heavily doped N and P type silicon wafers 11 and 12, respectively, between which is sandwiched a thin slab 13 of metal having an eutectic temperature with silicon, preferably gold or aluminum. Each of the semiconductor wafers 11 and 12 has a considerable surface area contacting the adjacent face of slab 13, as each of these bodies is a square having approximately ⅛" sides. Thereby, considerable current can flow between wafers 11 and 12 and the tunnel diode as finally constructed possesses large power handling capabilities.

To provide a junction having the necessary characteristics for tunneling, each of wafers 11 and 12 is heavily doped so they are degenerate. The semiconductors 11 and 12 are degenerate if there are approximately $5\times10^{19}$ to $1\times10^{21}$ impurities per cubic centimeter therein or if they have a resistivity of approximately $10^{-3}$ ohms cms. To establish the charged carrier relationship necessary for tunneling and prevent a pure metal region between wafers 11 and 12, it is necessary for the slab to be quite thin, approximately 100 mils while semiconductors 11 and 12 are approximately 1/32" thick.

The tunnel diode of the present invention has been fabricated by exerting sufficient pressure, in an air atmosphere, against the exposed surfaces of wafers 11 and 12 to force the semiconductors into intimate contact with the adjacent surfaces of plate 13. Heat is then applied, preferably from an electric source, for one to five minutes to raise the temperature of the interfaces of slab 13 with wafers 11 and 12 to a temperature slightly above the eutectic temperature, which for aluminum-silicon is 577° C. It is necessary to raise the temperature slightly above the eutectic point in order to melt the interfaces to compensate for the impurity content in semiconductors 11 and 12. The temperature to which the interfaces is raised is much lower than the melting point of silicon discs 11 and 12 so the possibility of impurity diffusion at any place other than the interface is prevented. After the structure is heated for the required time period, it is instantly cooled by being subjected to compressed air so wafers 11 and 12 are fused to form the cathode and anode of the tunnel diode. Other well known forms of cooling can be used, e.g. gaseous helium or argon can be supplied to the container in which the structure is located, with the container under a vacuum on the order of $10^{-6}$ mm. of Hg.

A device manufactured in accordance with the above described process has the characteristic curve shown in FIGURE 2 when P type wafer 12 is positively or forward biased relative to N type wafer 11. In the region between zero and 0.13 volt, considerable tunneling of electrons between wafers 11 and 12 occurs until a positive current of approximately 0.35 milliampere flows. As the forward bias is further increased between semiconductors 11 and 12 the effect of the tunneling current is decreased until a minimum of approximately 0.20 milliampere is reached at 0.3 volt. For greater forward biases, the normal diode current flow between wafers 11 and 12 is controlling and current thereafter increases with voltage.

While we have described and illustrated one specific embodiment of our invention, it will be clear that variations of the details of construction which are specifically illustrated and described may be resorted to without departing from the true spirit and scope of the invention as defined in the appended claims.

We claim:

1. A method for fabricating a tunnel diode junction comprising the steps of sandwiching a metal slab between a degeneratively doped P type monocrystalline semi-conductor wafer and a degeneratively doped N-type monocrystalline semiconductor wafer, said wafers and said slab having approximately the same sized adjacent faces, said wafers having the same bulk material, said material having a eutectic temperature with said slab, and heating the interfaces of said wafers and said slab to a value slightly in excess of the eutectic temperature of said slab and said material, said heating being discontinued and cooling initiated following melting at the interfaces at said value slightly in excess of the eutectic temperature, said metal slab being sufficiently thin relative to the thicknesses of said semiconductor wafers to go entirely into eutectic mixture with only a portion of each of said wafers during said heating step.

2. The method of claim 1 wherein said each of said wafers is doped silicon.

3. The method of claim 2 wherein said slab is gold.

4. The method of claim 2 wherein said slab is aluminum.

5. The method of claim 1 wherein said heating step is carried out in an environment of air.

References Cited

UNITED STATES PATENTS

| | | | |
|---|---|---|---|
| 2,654,059 | 9/1953 | Shockley | 317—235 |
| 2,701,326 | 2/1955 | Pfann | 148—1.5 X |
| 2,743,201 | 4/1956 | Johnson | 148—184 |
| 2,968,750 | 1/1961 | Noyce | 317—235 |
| 2,990,502 | 6/1961 | Willemese | 29—155.5 X |
| 2,998,334 | 8/1961 | Bakalar | 148—1.5 |

WILLIAM I. BROOKS, *Primary Examiner.*